United States Patent [19]
Ogino et al.

[11] Patent Number: 5,164,918
[45] Date of Patent: Nov. 17, 1992

[54] INTEGRATED CIRCUIT

[75] Inventors: Eiji Ogino, Tenri; Shigeki Imai, Nara; Masahiko Wada, Tenri, all of Japan

[73] Assignee: Sharp Kabushiki Kaisha, Osaka, Japan

[21] Appl. No.: 574,153

[22] Filed: Aug. 29, 1990

[30] Foreign Application Priority Data

Sep. 4, 1989 [JP] Japan .................... 1-228804

[51] Int. Cl.$^5$ .............................. G11C 7/00
[52] U.S. Cl. .................. 365/201; 365/189.07
[58] Field of Search ............ 365/201, 189.01, 189.07, 365/94; 371/21.1, 21.2

[56] References Cited

U.S. PATENT DOCUMENTS

4,905,142  2/1990  Matsubara et al. ............ 371/21.2 X

*Primary Examiner*—Joseph A. Popek
*Attorney, Agent, or Firm*—Nixon & Vanderhye

[57] ABSTRACT

An integrated circuit having a memory capable of being tested protects data stored in the memory from being read out of the integrated circuit during testing. Data input during memory testing is internally compared with data stored in the memory. The integrated circuit also outputs the accumulated comparison results. The output comparision result also may differ from the data in timing. An input unit includes an external terminal and a plurality of buffers for controlling data input and output to and from the integrated circuit.

12 Claims, 6 Drawing Sheets

INTEGRATED CIRCUIT

BACKGROUND OF THE INVENTION

1. Field of the Invention

The present invention relates to an integrated circuit with a memory incorporated therein.

2. Description of the Related Art

The inventors of the present invention know of an integrated circuit which is composed of a central processing unit (CPU), peripheral circuits associated with the CPU and a read-only memory (ROM) and fabricated on a single semiconductor chip. In the above-mentioned integrated circuit, the ROM is tested and the quality of the ROM is determined using the data obtained by comparing the data stored in and read out from the ROM with the data prepared beforehand.

However, in the above-mentioned integrated circuit, the data stored in the ROM is easily read out at a time when the ROM is tested, and as a result the data stored in the ROM can be readily analyzed by anybody and thus cannot be kept secret.

SUMMARY OF THE INVENTION

It is therefore an object of the present invention is to provide an integrated circuit which allows its memory to be tested without the data stored in the memory being read out.

An object of the present invention can be achieved by an integrated circuit having a memory and capable of testing the memory with protecting a data stored in the memory from being read out of the integrated circuit includes a unit for inputting a data into the memory, a unit connected with the input unit for controlling the input unit so that the data is input only into the input unit during a test of the memory, and a unit connected with the control unit for comparing the data input through the input unit with a data stored in the memory during the test of the memory.

The integrated circuit further includes a unit connected with the comparison unit for outputting a result of the comparison obtained by the comparison unit.

Preferably, the output unit is capable of outputting the result of the comparison in a signal which differs from the data in a predetermined timing.

Furthermore, the input unit is also connected with the comparison unit and is preferably capable of outputting the data stored in the memory from the integrated circuit.

Moreover, the input unit includes an external terminal and a plurality of buffers for controlling an input and an output of the integrated circuit, preferably.

The input unit includes two buffers, preferably one of the buffers being adapted to input a data from the external terminal into the integrated circuit, the other one of the buffers being adapted to output a data from the integrated circuit to the external terminal.

The other one of buffers outputs the data in accordance with a control signal, preferably.

Preferably, the control signal has two different states in accordance with states of the buffer, and the states of the buffers being either an input or an output state.

The comparison unit is also connected with the memory, and preferably includes a plurality of circuits, each of the circuits being composed of a plurality of logic circuit elements, and each of the logic circuit elements being an AND gate, and NOR gate or an OR gate.

Furthermore, the comparison unit is a comparator adapted to output the comparison result signal in accordance with a test mode signal.

More preferably, the comparison unit is a comparator adapted to output one byte comparison result signal.

The output unit includes a plurality of flip-flops disposed in parallel each other, preferably.

Preferably, one of the plurality of flip-flops is adapted to input the comparison result signal outputted from the comparison a unit, and a different one of the plurality of flip-flops is adapted to output a signal only at a time of testing the memory.

According to the first embodiment of the present invention, an output of data from a data input unit is inhibited during the test of a memory. The data which is input to the integrated circuit through the data input unit is compared with the data which is read out from the memory by a comparator in the integrated circuit, and the results of the comparison are taken out of the integrated circuit from an output terminal. In consequence, the quality of the memory can be determined using the obtained comparison results. At that time, since the data stored in the memory is not read out to an external circuit, the data in the memory can be kept secret.

According to the second embodiment of the present invention, an output of data from a data input unit is inhibited during the test of a memory. The data which is input to the integrated circuit through the data input unit is compared with the data which is read out from the memory by a comparator in the integrated circuit, and the results of the comparison are taken out of the integrated circuit from an output terminal, and the output control unit is adapted to control an comparison result and outputs the comparison result only once in a predetermined timing. As a result, functioning of the memory can be judged in accordance with the derived comparison result, and the stored data is kept secret because that the stored data of the memory is not read out to an outside.

Further objects and advantages of the present invention will be apparent from the following description, reference being had to the accompanying drawings wherein preferred embodiments of the present invention are clearly shown.

DESCRIPTION OF THE PREFERRED EMBODIMENTS

The first embodiment of the present invention will be described below with reference to the accompanying drawings.

Figure 1:
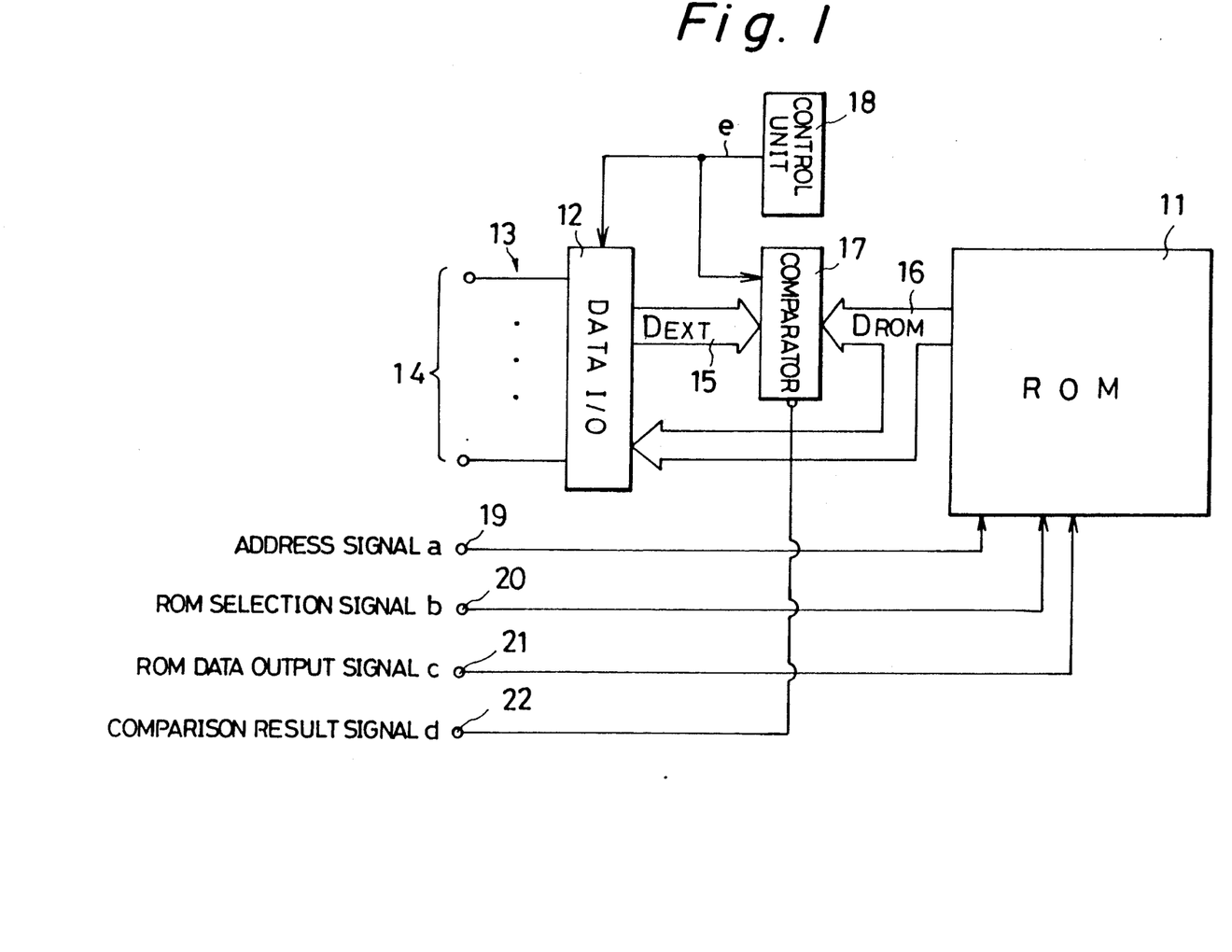
FIG. 1 shows the configuration of an embodiment of an integrated circuit according to the present invention.
Figure 2:
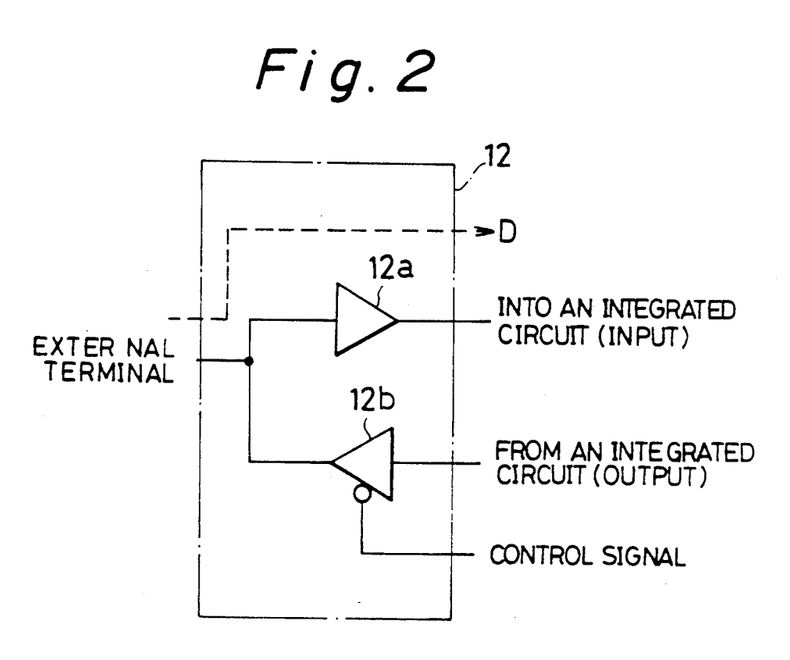
FIG. 2 shows the configuration of a data input/output unit of the integrated circuit of FIG. 1.

Referring first to FIG. 1, an integrated circuit includes a CPU (not shown), peripheral circuits which are associated with the CPU, and a ROM 11. One of the peripheral circuits is a data input unit (hereinafter described as a data input/output unit) 12 which is used to pass data into or out of the CPU. FIG. 2 shows the configuration of the data input/output unit 12 which is composed of two buffers 12a, 12b. One buffer 12a is adapted to input a data from an outside source through an external terminal to inside of the integrated circuit, and the other buffer 12b is adapted to output a data from the integrated circuit to the external terminal in accordance with a control signal Cs.

Figure 3:
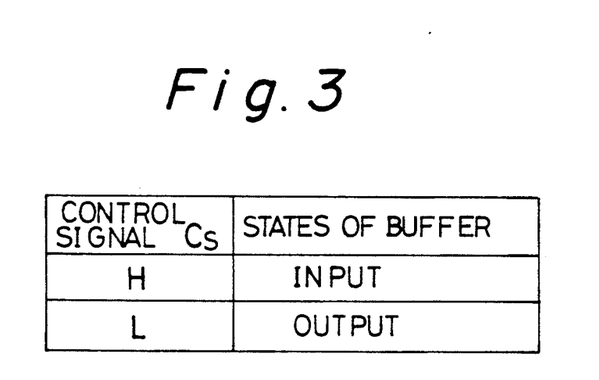
FIG. 3 shows the relation between the status of the data input/output unit and a control signal.

The data input/output unit 12 is connected to data input/output terminals through a data bus 13. The data input/output unit 12 assumes either one of the states shown in FIG. 3 in accordance with a state of a control signal Cs.

In addition to the above-described components, the integrated circuit includes a comparator 17 for comparing data $D_{EXT}$ which is input to the integrated circuit through the data input/output unit 12 and an internal data bus 15 with data $D_{ROM}$ which is read out from the ROM 11 through an internal data bus 16, and a control circuit 18 for allowing only an input of data from the data input/output unit 12 and activating the comparator 17 during the ROM test.

Besides the data input/output terminals 14, the integrated circuit has an input terminal 19 which receives and passes an address signal "a" which designates the address for the ROM 11, an input terminal 20 which receives and passes a ROM selection signal "b" which activates the ROM 11, an input terminal 21 which receives and passes a ROM data outputting signal "c" which instructs the ROM 11 about the reading-out of data, and an output terminal 22 which delivers a comparison result signal d from the comparator 17. The input terminals 19 to 21 are connected to the ROM 11.

Figure 4:
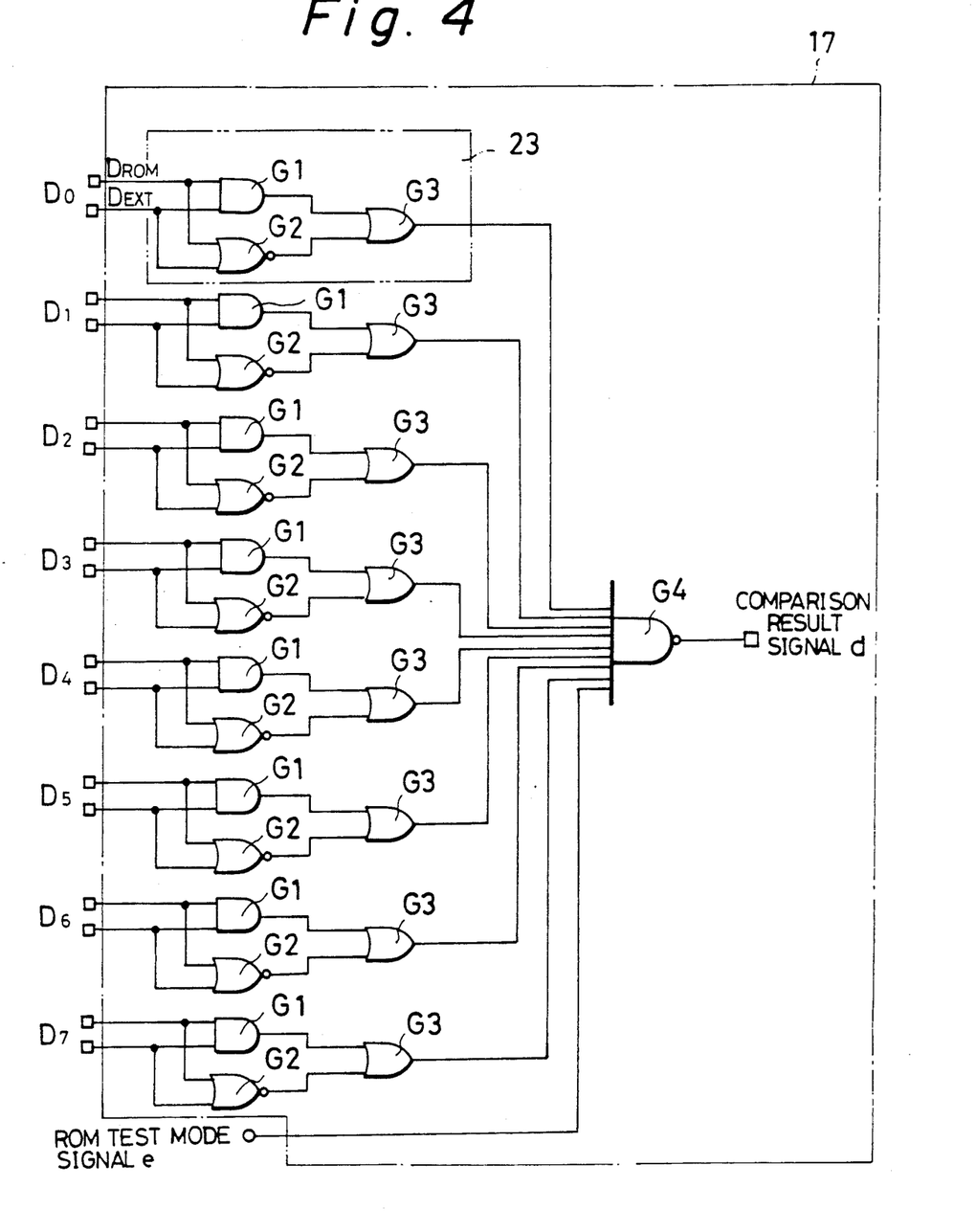
FIG. 4 shows the configuration of a comparator in the integrated circuit of FIG. 1.

FIG. 4 is a circuit diagram of a practical example of the comparator 17 shown in FIG. 1. In the comparator shown in FIG. 4, 8-bit data $D_{EXT}$ which is input from an external circuit is compared with 8-bit data $D_{ROM}$ which is read out from the ROM 11. In order to achieve this comparison, circuit units 23, each of which is composed of an AND gate G1, a NOR gate G2 and an OR gate G3, are provided in one-to-one correspondence with the individual bits $D_0$ to $D_7$ of the data $D_{EXT}$ and data $D_{ROM}$. More specifically, in the circuit unit 23 corresponding to, for example, the first bit $D_0$ in the data $D_{EXT}$ and data $D_{ROM}$, the first bit $D_0$ of the data $D_{EXT}$ is given to one of the two input terminals of the AND gate G1 and to one of the two input terminals of the NOR gate G2, and the first bit $D_0$ of the data $D_{ROM}$ is given to the other input terminal of the AND gate G1 and to the other input terminal of the NOR gate G2. The output of the AND gate G1 is given to one of the two input terminals of the OR gate G3, and the output of the NOR gate G2 is given to the other input terminals of the OR gate G3. The output of the circuit unit 23 corresponding to the first bit $D_0$ is given to one of the input terminals of a NAND gate G4. Thus, the NAND gate G4 receives at its input terminals the outputs of the respective circuit units 23 corresponding to the respective bits $D_0$ to $D_7$ of the data $D_{EXT}$ and $D_{ROM}$, and outputs a comparison result signal d.

The operation of the integrated circuit which is performed when the ROM 11 is tested will be described below. When the ROM 11 is to be tested, the control circuit 18 outputs a ROM test mode signal "e" to the data input/output units 12 and to the comparator 17 to inhibit output of data from the data input/output unit 12 and to make the comparator 17 ready for the test.

The above ROM test is normally performed once when a semiconductor integrated circuit with the integrated circuit according to the present invention incorporated therein is shipped from a plant.

In the above-described state, the address signal "a" for the ROM 11, the ROM selection signal "b" and the ROM data outputting signal "c" are respectively input from the input terminals 19, 20 and 21 while the data $D_{EXT}$ which is to be made to correspond to the data $D_{ROM}$ read out from the address in the ROM 11 designated by the address signal "a" is input from the data input/output terminals 14. The data $D_{EXT}$ is input to the comparator 17 through the data input/output unit 12 and the internal data bus 15 where it is compared with the data $D_{ROM}$ read out from the ROM 11 through the internal data bus 16. The obtained comparison result signal d is output from the output terminal 22.

In the comparator 17 shown in FIG. 4, which is designed to employ 8-bit data $D_{EXT}$ and $D_{ROM}$, when the respective bits of the data $D_{EXT}$ coincide with the corresponding bits of the data $D_{ROM}$, the output of either the AND gate G1 or the NOR gate G2 rises in each circuit unit 23, raising the output of each circuit unit 23 and lowering the output of the NAND gate G4, i.e., the comparison result signal d.

When either of the bits of the data $D_{EXT}$ does not coincide with the corresponding bit of the data $D_{ROM}$, both the outputs of the AND gate G1 and the NOR gate G2 fall in the corresponding circuit unit 23, lowering the output of that circuit unit 23. In consequence, the output of the NAND gate G4, i.e., the comparison result signal d, rises. As a result, ROM 11 faults can be detected on the basis of the comparison result signal d output from the output terminal 22.

As stated above, since an output of data from the data input/output unit 12 is inhibited during the ROM test, the data stored in the ROM 11 cannot be read out to the data input/output terminals 14. In consequence, the data stored in the ROM 11 can be kept secret.

During the normal use of the integrated circuit, since the ROM test mode signal "e" is not output from the control circuit 18, an input of data in and an output of data from the data input/output unit 12 are allowed. In consequence, normal data input and output are performed through the data input/output unit 12.

In the following part, the second embodiment of the present invention is described in detail.

Figure 5:
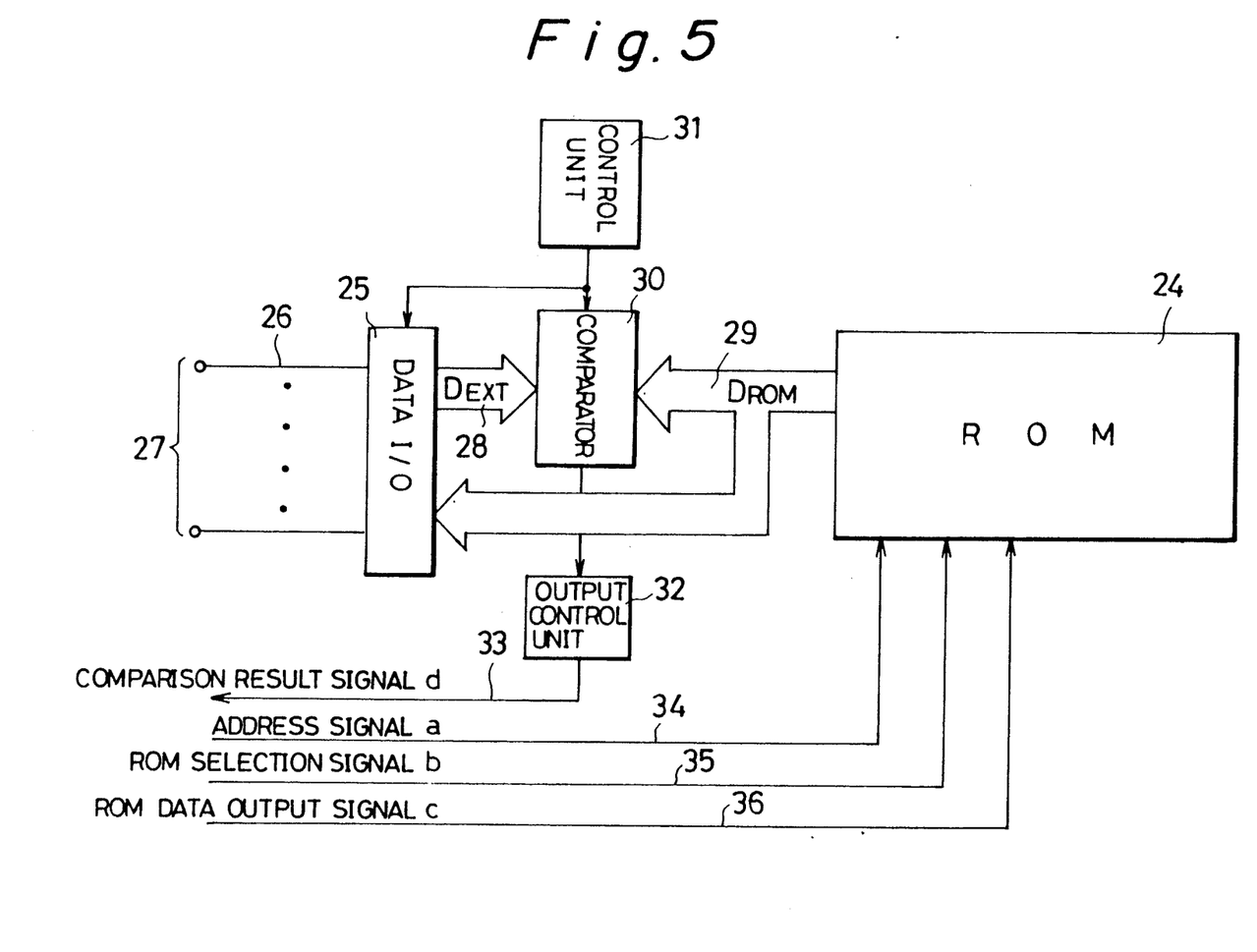
FIG. 5 shows an configuration of another embodiment of an integrated circuit in accordance with the present invention.

Referring first to FIG. 5, an integrated circuit includes a CPU (not shown), peripheral circuits which are associated with the CPU, and a ROM 24. One of the peripheral circuits is a data input/output unit 25 which is used to pass data into or out of the CPU. The data input/output unit 25 has the same configuration of the data input/output unit 12, therefore the description of the configuration is omitted here. Also, the descriptions of other parts in the second embodiment which are the same as the first embodiment will be omitted hereinafter.

In addition to the above-described components, the integrated circuit includes a comparator 30 for comparing data $D_{EXT}$ which is input to the integrated circuit through the data input/output unit 25 and an internal data bus 28 with data $D_{ROM}$ which is read out from the ROM 24 through an internal data bus 29, and a control circuit 31 for allowing only an input of data to the data input/output unit 25 and activating the comparator 30 during the test of ROM 24, and an output control unit 32 for controlling a comparison result so that the comparison result is output in a predetermined timing only once.

Besides the data input/output terminals 27, the integrated circuit has an input terminal 34 which receives and passes an address signal "a" which designates the address for the ROM 24, an input terminal 35 which receives and passes a ROM selection signal "b" which activates the ROM 24, an input terminal 36 which receives and passes a ROM data outputting signal "c" which instructs the ROM 24 about the reading-out of data, and an output terminal 33 which delivers a comparison result signal d from the comparator 30.

Figure 6:
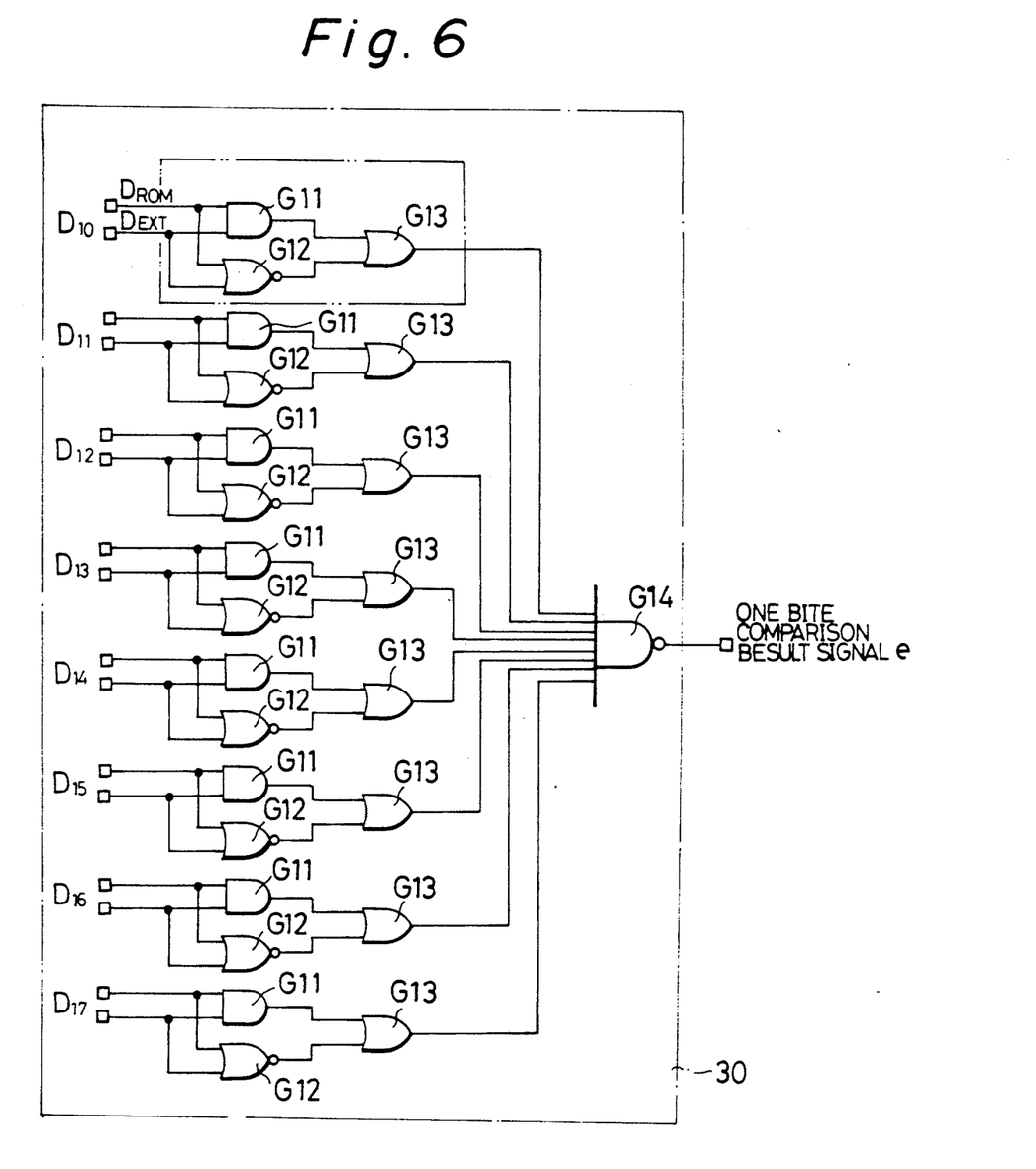
FIG. 6 illustrates an example of an electric circuit diagram of the comparator shows in FIG. 5.

FIG. 6 is a circuit diagram of a practical example of the comparator 30 shown in FIG. 1. In the comparator shown in FIG. 6, 8-bit data $D_{EXT}$ which is input from an external circuit is compared with 8-bit data $D_{ROM}$ which is read out from the ROM 24. In order to achieve this comparison, circuit units 37, each of which is composed of an AND gate G11, a NOR gate G12 and an OR gate G13, are provided in one-to-one correspondence with the individual bits $D_{10}$ to $D_{17}$ of the data $D_{EXT}$ and data $D_{ROM}$. More specifically, in the circuit unit 37 corresponding to, for example, the first bit $D_{10}$ in the data $D_{EXT}$ and data $D_{ROM}$, the first bit $D_{10}$ of the data $D_{EXT}$ is given to one of the two input terminals of the AND gate G11 and to one of the two input terminals of the NOR gate G12, and the first bit $D_{10}$ of the data $D_{ROM}$ is given to the other input terminal of the AND gate G11 and to the other input terminal of the NOR gate G12. The output of the AND gate G11 is given to one of the two input terminals of the OR gate G13, and the output of the NOR gate G12 is given to the other input terminal of the OR gate G13. The output of the circuit unit 37 corresponding to the first bit $D_{10}$ is given to one of the input terminals of a NAND gate G14. Thus, the NAND gate G4 receives at its input terminals the outputs of the respective circuit units 37 corresponding to the respective bits $D_{10}$ to $D_{17}$ of the data $D_{EXT}$ and $D_{ROM}$, and outputs a one-byte comparison result signal e.

Figure 7:
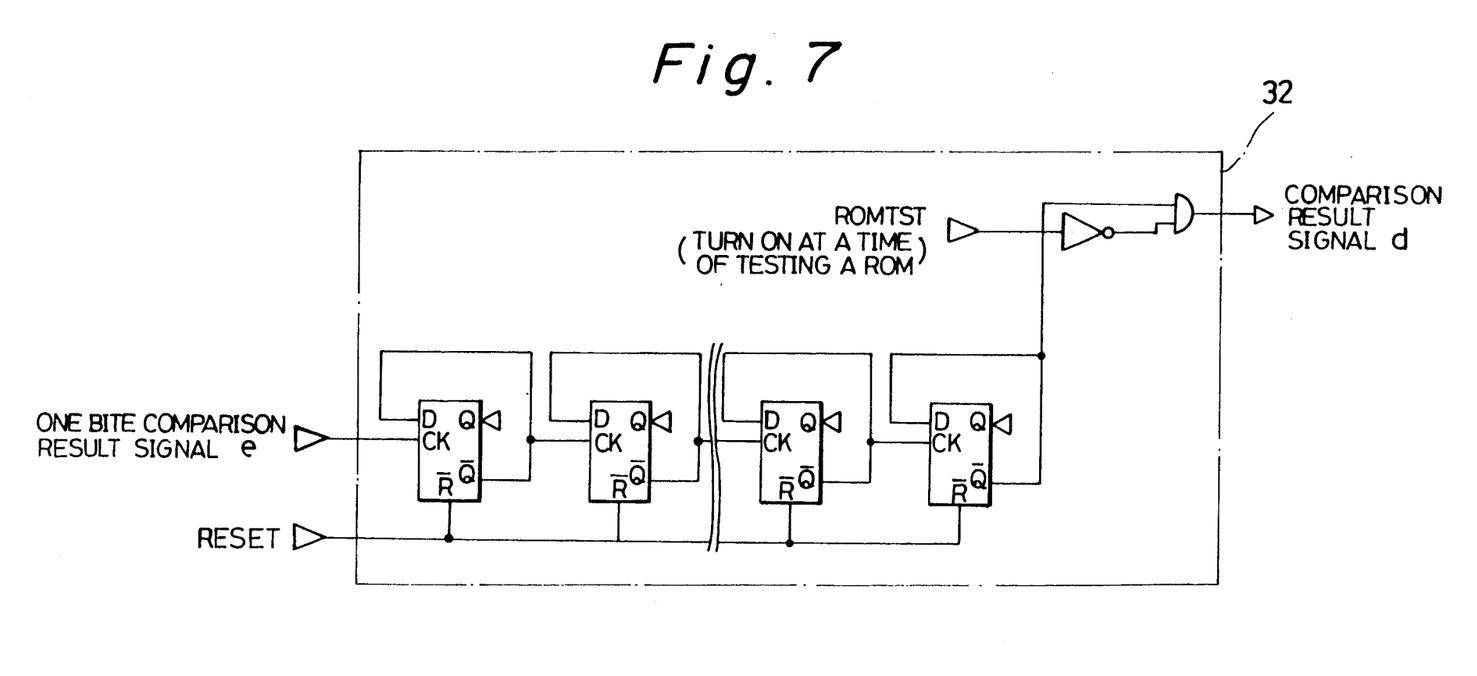
FIG. 7 shows an example of an electric circuit diagram of the output control unit in FIG. 5.

FIG. 7 illustrates an electric circuit diagram which shows a configuration of the output control unit 32 of FIG. 5. In FIG. 7, the electric circuit diagram is the output control unit corresponding with a capacity of 8K bytes. The output control signal shown in FIG. 7 receives a one-byte comparison result signal "e", and counts upwardly in a case that the comparison result received is a positive.

In a case that the comparison results are all positive after comparing all 8K bites, then the output control unit 8 outputs a comparison result signal "d".

However, the comparison result signal "d" is controlled in accordance with the ROMTST signal, and the comparison result signal "d" can be so arranged that it is output only at a time of ROM test mode.

The capacity of the output control unit can be changed easily by changing a number of flip-flops (shown in FIG. 7) corresponding with a change of a capacity of ROM, for examples, 2K, 4K, 16K, 32K bytes or more. In FIG. 7, only four flip-flops are shown as an example, but the number of the flip-flops are not limited with four.

Many widely different embodiments of the present invention may be constructed without departing from the spirit and scope of the present invention. It should be understood that the present invention is not limited to the specific embodiments described in this specification, except as defined in the appended claims.

What is claimed is:

1. An integrated circuit having a memory capable of being tested while simultaneously protecting and preventing data stored in the memory from being read out from the integrated circuit, said integrated circuit comprising:
   means for inputting data into said memory and outputting data stored in said memory from said integrated circuit, said inputting means having an external terminal and a plurality of temporary storage elements;
   means connected to said inputting means for controlling said inputting means so that said data is only input into said inputting means during a test of said memory; and
   means connected to said control means for comparing said data input through said inputting means with data stored in said memory during said test of said memory, said comparing means having a plurality of logic circuits, each of said logic circuits being composed of a plurality of logic circuit elements.

2. An integrated circuit according to claim 1, wherein said plurality of temporary storage elements include two buffers for respectively controlling an input and an output of said integrated circuit, one of said buffers being adapted to input data from said external terminal into said integrated circuit, the other one of said buffers being adapted to output data from said integrated circuit to said external terminal in accordance with a control signal.

3. An integrated circuit according to claim 2, wherein said control signal has two different states in accordance with states of said buffer, said states of said buffer being either an input or an output state.

4. An integrated circuit according to claim 1, wherein said plurality of logic circuit elements include an AND gate having a plurality of input terminals and an output terminals and an output terminal, a NOR gate having a plurality of input terminals and an output terminal, and an OR gate having a plurality of input terminals and an output terminal, one of said input terminals of said OR gate being connected to said output terminal of said AND gate and the another one of said input terminals of said OR gate being connected to said output terminal of said NOR gate.

5. An integrated circuit according to claim 4, wherein said comparing means further comprises a NAND gate having a plurality of input terminals and an output terminal, each of said plurality of input terminals being connected to each of said output terminals of said OR gates forming said plurality of logic circuits, respectively.

6. An integrated circuit according to claim 5, wherein said comparing means includes a comparator which is capable of outputting a signal representing a comparison result in a test mode.

7. An integrated circuit according to claim 6, wherein said integrated circuit further comprises an output control means connected to said comparing means for causing said comparison result to be output only once at a predetermined time.

8. An integrated circuit according to claim 7, wherein said output control means includes a plurality of serially connected flip-flops.

9. An integrated circuit according to claim 8, wherein the number of said plurality of flip-flops corresponds to the data storage capacity of said memory.

10. An integrated circuit according to claim 8, wherein one of said plurality of flip-flops is capable of accepting said comparison result output from said comparing means, and another one of said plurality of flip-flops is capable of outputting a signal only at a time of testing said memory.

11. An integrated circuit according to claim 10, wherein each of said plurality of flip-flops has an input terminal which receives a clock signal, and said comparison result output from said comparing means is supplied to said input terminal so that no additional clock signal is required to be input.

12. An integrated circuit according to claim 10, wherein said comparing means is capable of comparing all memory data.

* * * * *